United States Patent [19]
McKee et al.

[11] Patent Number: 5,856,033
[45] Date of Patent: *Jan. 5, 1999

[54] PROCESS FOR GROWING A FILM EPITAXIALLY UPON AN OXIDE SURFACE AND STRUCTURES FORMED WITH THE PROCESS

[75] Inventors: Rodney Allen McKee, Kingston; Frederick Joseph Walker, Oak Ridge, both of Tenn.

[73] Assignee: Martin Marietta Energy Systems, Inc., Oak Ridge, Tenn.

[ * ] Notice: The term of this patent shall not extend beyond the expiration date of Pat. No. 5,804,323.

[21] Appl. No.: 517,547

[22] Filed: Aug. 21, 1995

Related U.S. Application Data

[60] Division of Ser. No. 163,427, Dec. 8, 1993, Pat. No. 5,450,812, which is a continuation-in-part of Ser. No. 100,743, Jul. 30, 1993, abandoned.

[51] Int. Cl.⁶ ..................................................... B32B 15/00
[52] U.S. Cl. .......................... 428/699; 428/700; 428/701; 428/702
[58] Field of Search ..................................... 428/697, 699, 428/700, 701, 702; 252/62.3 BT, 62.9 R, 62.9 PZT; 505/330, 701; 423/592, 593, 594; 117/108

[56] References Cited

U.S. PATENT DOCUMENTS

| | | | |
|---|---|---|---|
| 5,084,265 | 1/1992 | Harada | 423/592 |
| 5,221,367 | 6/1993 | Chisholm | 148/33 |
| 5,225,031 | 7/1993 | McKee | 156/612 |
| 5,256,244 | 10/1993 | Ackerman | 156/613 |
| 5,323,023 | 6/1994 | Fork | 505/235 |

*Primary Examiner*—Timothy Speer
*Attorney, Agent, or Firm*—Michael E. McKee; George L. Craig

[57] ABSTRACT

A process and structure wherein a film comprised of a perovskite or a spinel is built epitaxially upon a surface, such as an alkaline earth oxide surface, involves the epitaxial build up of alternating constituent metal oxide planes of the perovskite or spinel. The first layer of metal oxide built upon the surface includes a metal element which provides a small cation in the crystalline structure of the perovskite or spinel, and the second layer of metal oxide built upon the surface includes a metal element which provides a large cation in the crystalline structure of the perovskite or spinel. The layering sequence involved in the film build up reduces problems which would otherwise result from the interfacial electrostatics at the first atomic layers, and these oxides can be stabilized as commensurate thin films at a unit cell thickness or grown with high crystal quality to thicknesses of 0.5–0.7 μm for optical device applications.

7 Claims, 5 Drawing Sheets

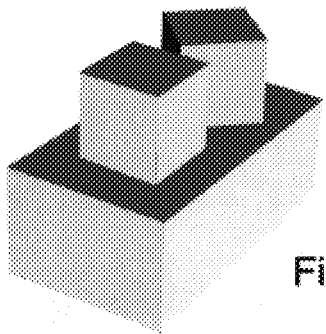
Fig. 5
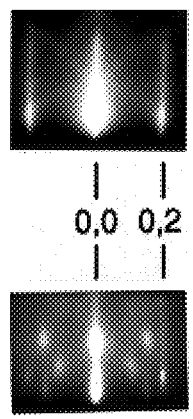
Fig. 6a
0,0  0,2
Fig. 6b

Diffraction from clean (001) MgO surface;

[100] zone axis 0,0   0,2

Diffraction from 1 ML TiO on (001)MgO;

[100] zone axis 0,1
0,0   0,2

(001) MgO $Mg^{2+}$ $O^{2-}$ $Ti^{4+}$

|— $d_{100}$ —|

1 ML TiO structure on (001) MgO

|  | SrTiO₃/MgO | BaTiO₃/MgO |
|---|---|---|
| Thickness, nm | 515 | 610 |
| Latt. Parameter<br>in-plane<br>out-of-plane | 0.3898 nm<br>0.3913 nm | 0.4000 nm<br>0.4020 nm |
| Rocking curve<br>Width<br>in-plane<br>out-of-plane | 0.37° FWHM<br>0.62° FWHM | 0.40° FWHM<br>0.70° FWHM |
| Index of Refraction<br>@ 632 nm | 2.379 | 2.437 |

PROCESS FOR GROWING A FILM EPITAXIALLY UPON AN OXIDE SURFACE AND STRUCTURES FORMED WITH THE PROCESS

This is a divisional of application Ser. No. 08/163,427, now U.S. Pat. No. 5,450,812 filed Dec. 8, 1993, which is a continuation-in-part of application Ser. No. 08/100,743 filed Jul. 30, 1993 now abandoned and entitled PROCESS FOR GROWING A FILM EPITAXIALLY UPON AN MgO SURFACE AND STRUCTURES FORMED WITH THE PROCESS, the disclosure of which is incorporated herein by reference.

BACKGROUND OF THE INVENTION

This invention relates generally to the preparation of structures for use in semiconductor and/or optical wave guide applications and relates, more particularly, to the growth of an epitaxial film upon surfaces, such as an alkaline earth oxide surface.

Oxides in a class of oxides known as perovskites and spinels are known to exhibit technologically-significant properties, such as ferroelectricity, ferromagnetism, piezoelectricity, superconductivity and nonlinear electro-optic behavior, and for this reason, are grown upon substrates for the purpose of incorporating these properties within electronic devices. With such oxides grown upon substrates, the aforementioned properties can be taken advantage of in a number of devices, and in particular, are believed to be well-suited for use in Faraday Rotators for optical isolators and in magnetic memory applications.

Of these electronic devices, optical guided wave (OGW) devices constructed with perovskites are relatively demanding from the standpoint of optical clarity and necessarily require long range structural coherence. Heretofore, the optical clarity and structural coherence of a perovskite film grown upon an alkaline earth oxide, such as MgO, has been limited due, at least in part, to the inability to grow a perovskite upon the alkaline earth wherein the grown perovskite is of a single orientation. It would be desirable to provide a process for growing perovskite of single-orientation upon an alkaline earth oxide and thus enhance the quality of the resulting structure for OGW applications.

Accordingly, an object of the present invention is to provide a new and improved process for growing a perovskite or a spinel of single orientation on an alkaline earth oxide and structures formed with the process.

Another object of the present invention is to provide such a process which is well-suited for coating an alkaline earth oxide surface with a single layer of a Group IVA element oxide, i.e. $TiO_2$, $ZrO_2$ or $HfO_2$.

Still another object of the present invention is to provide such a structure which is well-suited for use in an OGW applications or for incorporation within an integrated circuit.

Yet another object is to provide a new and improved process for growing a perovskite or a spinel or constituents of a perovskite or spinel epitaxially upon a surface provided by a Group IVA element oxide or an oxide constituent of a perovskite or a spinel and structures formed with the process.

A further object of the present invention is to provide such a structure whose ferromagnetic properties render it well-suited for use in magneto-optic applications.

SUMMARY OF THE INVENTION

This invention resides in a process for coating a body with an epitaxial film wherein the body has a surface provided by one of an alkaline earth oxide, a Group IVA element oxide, an oxide constituent of a perovskite and an oxide constituent of a spinel and structures formed with the process.

One embodiment of the process includes the steps of growing, by molecular beam epitaxy (MBE) techniques, a single plane of metal oxide having a metal element of a group of metals consisting of Ti, Zr, Hf, V, Cr, Mn, Fe, Co, Ni and Cu upon a surface provided by an alkaline earth oxide so that the metal and oxygen atoms of the single plane are disposed at ordered sites across the alkaline earth oxide surface. In a further embodiment of the method, the step of growing a single plane of metal oxide of the aforementioned group of oxides is followed by the step of growing, by MBE techniques, a constituent metal oxide plane of a perovskite or a spinel upon the single plane of metal oxide wherein the metal of the constituent metal oxide plane provides the large cation in the perovskite or spinel crystalline structure.

In another embodiment of the process, the body upon which an epitaxial film is coated has a surface defined by metal oxide provided by either a Group IVA element oxide or an oxide constituent of a perovskite or spinel crystal wherein the metal element of the metal oxide provides a relatively small cation in the crystalline form of the metal oxide and the metal and oxygen atoms of the metal oxide are disposed at ordered sites across the oxide surface. This process embodiment includes the steps of growing, by MBE techniques, a constituent metal oxide plane of a perovskite crystal or a spinel crystal epitaxially upon the single plane of metal oxide wherein the metal element of the constituent metal oxide plane provides a relatively large cation in the perovskite or spinel crystalline structure.

BRIEF DESCRIPTION OF THE DRAWINGS

FIG. 5 is a cube model representing the lattice orientation at the interface of a structure wherein an MgO surface is covered with BaO.

FIG. 6a is a photograph providing RHEED data for a clean MgO surface wherein the data is obtained along a [100] zone axis.

FIG. 6b is a photograph providing RHEED data for a single layer coverage of BaO on (001)MgO wherein the data is obtained along a [100] zone axis.

DETAILED DESCRIPTION OF ILLUSTRATIVE EMBODIMENTS

Figure 1:
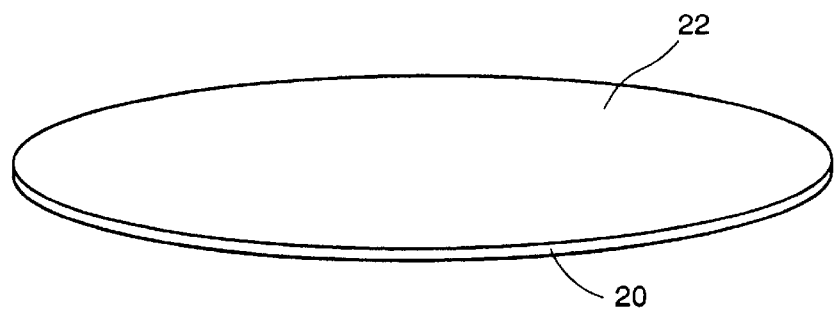
FIG. 1 is a perspective view of a body upon which an epitaxial perovskite or spinel can be grown in accordance with an embodiment of the method of the present invention.

Turning now to the drawings in greater detail, there is shown in FIG. 1 a body or wafer 20 having a surface 22 defined by substrate layer of an alkaline earth oxide, i.e. the (001) face, upon which a perovskite or spinel of single-orientation can be grown. In the interests of the present invention, the surface layer of the alkaline earth oxide can be provided by the outer layer of a body comprised entirely of the alkaline earth oxide or the outer layer of a series of layers formed upon a base substrate comprised, for example, of a semi-conducting material such as silicon. In either instance, however, the crystalline structure of the alkaline earth oxide is clean, ordered and atomically smooth to promote the subsequent epitaxial growth thereupon of constituents of a perovskite crystal.

The crystalline lattice structure of perovskite is a simple cubic structure and includes a plane of a Group IVA element oxide, i.e. an oxide of a group consisting of $TiO_2$, $ZrO_2$, and $HfO_2$, and another plane of a different metal oxide. For example, the crystalline lattice structure of the perovskite $BaTiO_3$ includes a plane of $TiO_2$ and a plane of BaO. Similarly, the bulk crystalline structure of the perovskite $SrTiO_3$ includes a plane of $TiO_2$ and a plane of SrO. As will be apparent, an embodiment of the process of the invention described herein involves the initial formation of a plane of a Group IVA element oxide upon the alkaline earth oxide surface and the subsequent formation of additional planes of metal oxide and a Group IVA element oxide upon the initial plane of the Group IVA element oxide so that the subsequently-formed planes alternate with one another.

As will be apparent herein, the crystalline lattice structure of an oxide in the oxide class known as spinel is comparable to the crystalline lattice structure of a perovskite, i.e. is a simple cubic structure, in a manner which renders the present invention applicable to the growth of spinels, as well as perovskites.

Figure 2:
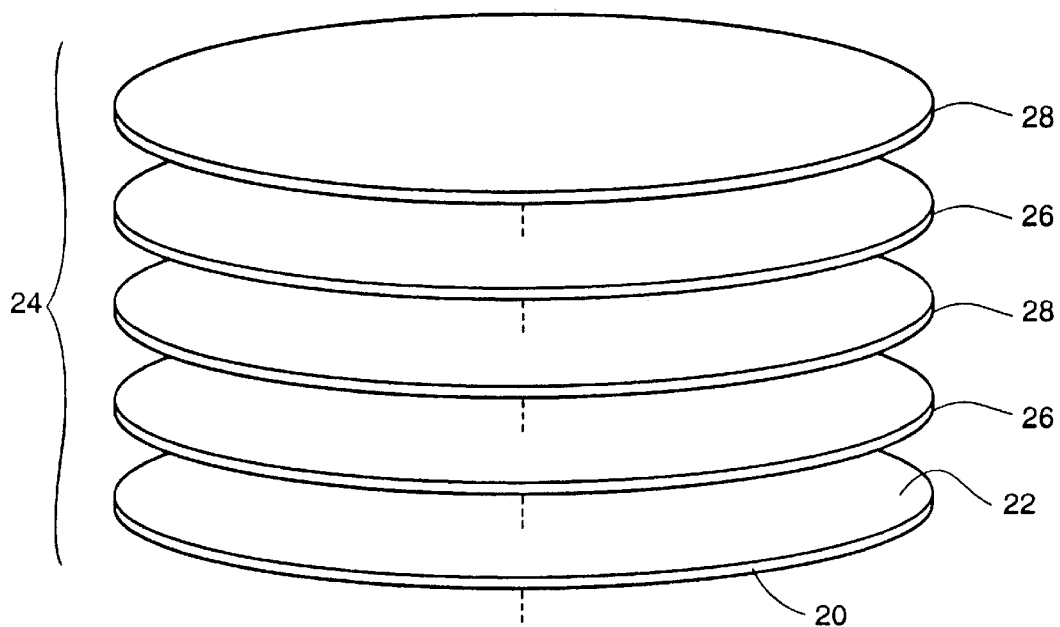
FIG. 2 is an exploded perspective view of a structure within which a film of perovskite is grown upon a layer of MgO and illustrating schematically the successive layers of constituents comprising the structure.
Figure 3:
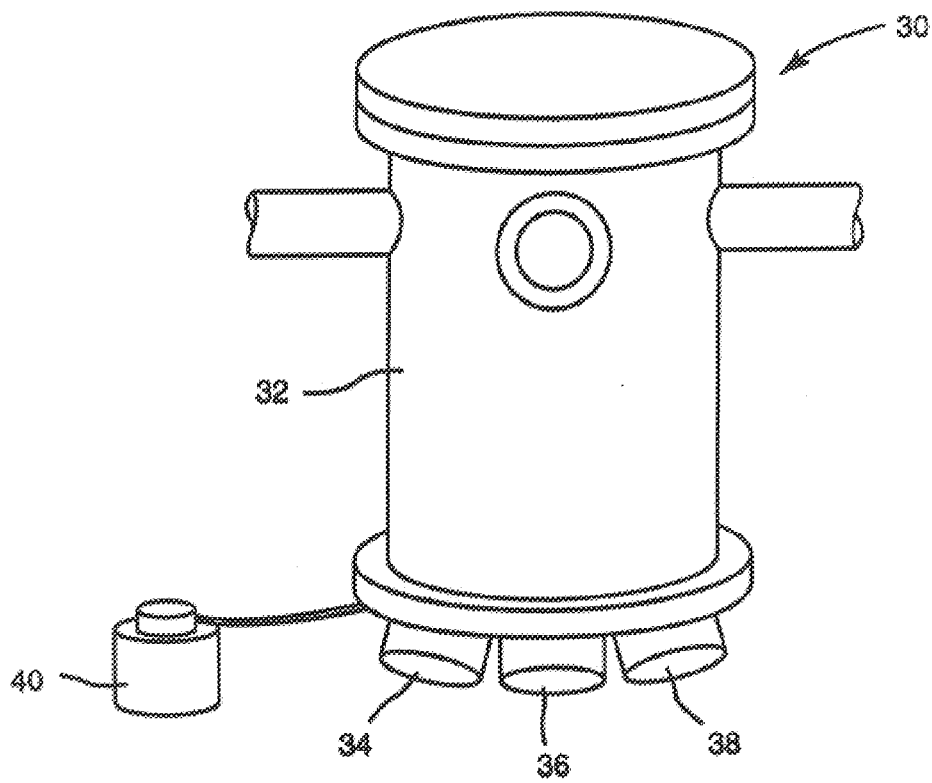
FIG. 3 is a schematic perspective view of ultra high vacuum equipment with which steps of the present invention may be performed.

With reference to FIG. 2, there is illustrated an exemplary structure, indicated 24, upon which alternating planes 26 and 28 of the Group IVA element oxide $TiO_2$ and metal oxide, respectively, are formed upon the alkaline earth oxide surface 22 comprised, in this instance, of MgO. Each plane 26 or 28 is formed upon the MgO surface 22 by molecular beam epitaxy (MBE) techniques and with MBE equipment. Briefly, the MBE equipment with which the process described herein can be carried out includes an ultra high vacuum (UHV) growth/characterization facility, a fragment of which is indicated 30 in FIG. 3. The facility 30 includes a container 32 having an inner chamber within which the body 20 is positioned so that its surface 22 faces downwardly, and a plurality of canisters 34, 36 and 38 are provided within the base of the container 32 for providing a vapor source of metal desired to be added to the substrate surface during the formation of the structure 24. In this connection, each canister 34, 36 and 38 is adapted to hold a crucible containing a desired metal, and in this case, the canisters hold metal constituents of the perovskite, e.g., $BaTiO_3$, $SrTiO_3$, $CaTiO_3$ or $MgTiO_3$, desired to be formed upon the MgO surface 24.

An opening is provided in the top of each canister, and a shutter is associated with the canister opening for movement between a closed condition at which the interior of the canister is closed and thereby isolated from the MgO surface 22 and a closed condition at which the contents of the container 32, i.e., the metal vapor, is exposed to the MgO surface 22. In addition, an oxygen source 40 is connected to the chamber so that by opening and closing a valve associated with the source 40, oxygen can be delivered to or shut off from the chamber. The opening and closing of each canister shutter and the oxygen source valve is accurately controlled by a computer controller (not shown).

Before the desired layers, or planes, are grown upon the MgO surface 22, the MgO surface is rendered atomically smooth. To this end, the MgO surface 22 can be treated with a polishing compound which is commercially available as a cleaner under the trade designation Syton. The body 20 is then placed within the UHV facility 30, and the temperature of the body 20 is raised to about 1000° C. At this elevated temperature, unwanted contaminants, such as water and dirt, are driven from the surface 22 and Mg ions which may be under strain at the surface 22 are permitted to shift to a more stable, or relieved, position. While maintaining suitable control over the operation of the MBE facility 30, MgO is grown onto the surface 22 to restore crystalline perfection at the MgO surface as MgO is deposited within so as to fill voids or similar defects which may exist across the surface 22. By growing an additional thickness of about 1000 Å of Mg onto the surface 22, the desired cleanliness and smoothness of the surface 22 is obtained.

In preparation of the growth of $TiO_2$ onto the MgO surface 22, the pressure in the UVH chamber is lowered to between about $2-5\times10^{-7}$ torr. The desired layer of $TiO_2$ is then built upon the MgO surface 22 by conventional MBE techniques while the chamber pressure is maintained between about $2-5\times10^{-7}$ torr. For example, Ti metal vapor could initially be deposited upon the MgO surface 22 and then oxygen from the source 40 could be released over the surface so that the desired layer of $TiO_2$ is formed at the surface 22. Alternatively, the surface 22 could be simultaneously exposed to Ti vapor and oxygen, in controlled amounts, so that $TiO_2$ forms and then accumulates on the surface 22.

During either of the aforementioned deposition processes involving the $TiO_2$ layer, careful control of the MBE operation is maintained to ensure that no more than one layer, i.e., one plane, of $TiO_2$ is deposited upon the surface 22. The bulk form of the compound $TiO_2$, as characterized by the ordered surface structure formed in this step, has a nonequilibrium structure and is not found in nature, and there exists a tendency for the formed $TiO_2$ to accumulate into clusters if the surface 22 is exposed to a greater amount of $TiO_2$ than is needed to comprise a single plane of $TiO_2$. Of course, if such clusters develop, the $TiO_2$ layer looses its order, and the ability to grow ordered layers upon the $TiO_2$ layer is destroyed. Thus, careful control must be maintained over the deposition of Ti vapor and the release of oxygen from the source 40 so that a single layer, and only a single layer, of $TiO_2$ accumulates at ordered sites upon the MgO surface 22.

Following the development of the desired layer of $TiO_2$ upon the MgO surface 22, a layer of metal oxide which comprises the other plane of the desired perovskite is formed upon the $TiO_2$ layer. If, for example, the desired perovskite is $BaTiO_3$, then the vapor released in the facility chamber is Ba, and if the desired perovskite is $SrTiO_3$, then the vapor released into the chamber facility is Sr.

Conventional MBE techniques are used to grow the desired oxide, e.g., BaO or SrO, layer upon the formed $TiO_2$ layer. For example, the metal vapor, e.g., Ba or Sr, may be initially deposited upon the $TiO_2$ surface, and then the oxygen may be subsequently released into the chamber so that the metal oxide forms upon the $TiO_2$ surface. Alternatively, the $TiO_2$ layer could be simultaneously exposed to metal vapor and oxygen so that the metal oxide accumulates on the $TiO_2$ layer. In either event, careful control should be maintained over the deposition operation here so that no more than one plane of the desired metal oxide is developed at this stage upon the $TiO_2$ layer and so that the pattern of metal oxide deposited upon the $TiO_3$ layer is ordered.

Upon formation of the desired plane of metal oxide, a second plane of $TiO_2$ is grown upon the metal oxide plane in accordance with the aforedescribed techniques used to grow $TiO_2$ onto the MgO surface. Then, upon formation of the desired second plane of $TiO_2$, a second plane of the metal oxide, e.g., BaO or SrO, is grown upon the second plane of $TiO_2$.

Thereafter, layers of $TiO_2$ and metal oxide are formed in an alternating fashion until at least about twenty-five cell units of the desired perovskite are grown upon the MgO surface. Dislocations which may develop within the formed layers nucleate so as to provide internal strain relief within the first twenty-five cell units so that lattice strain does not appear at the surface of the layup of planes. Thus, the surface defined by the twenty-fifth cell unit is ordered and free of strain.

Once the strain-free surface of perovskite is formed, steps can then be taken to grow addition layers of the perovskite upon the build up of cell units. In this connection, subsequent growth of the perovskite upon its strain-free bulk form is homoepitaxial, rather than heteroepitaxial so that the characteristics of the interface between adjacent layers of $TiO_2$ and metal oxide are not likely to present problems during growth. Thus, the perovskite can be built upon itself after the initial twenty-five cell units of perovskite are formed. To this end, the perovskite is grown layer-by-layer upon the strain-free surface by conventional MBE techniques to that each layer of perovskite is one cell unit high. For example, the strain free surface may be initially be exposed to Ti and metal, e.g., Ba or Sr, vapors and then to oxygen so that the perovskites forms upon the strain-free surface. Alternatively, the strain-free surface can be exposed simultaneously to the Ti and metal vapors and oxygen so that the perovskite forms and then settles upon the strain-free surface. In either instance, careful control of the MgO process is maintained so that the build up of successive layers of the perovskite is effected epitaxially.

The clarity of the resulting perovskite is realized, at least in part, by the aforedescribed build up of alternating layers of $TiO_2$ and metal oxide on the MgO surface in that this build up minimizes undersirable effects which could otherwise result from interfacial electrostatics developed between MgO and the superposed layers subsequently grown thereon. To appreciate the interfacial electrostatics issue, the structure of the perovskite oxides can be considered. The distinguishing characteristic of the perovskite oxide class is recognized as a closest-packing of large cations and oxygen anions arranged as stacked sheets normal to a [111] direction. The octahedral interstices that form as a result of this sheet-stacking sequence are in turn filled with higher valence, smaller cations. The resulting structures are cubic with low index stable crystal faces. The naturally occuring crystal truncations are {001} and are then, for example with $BaTiO_3$, either BaO planes or $TiO_2$ planes, as mentioned earlier. The ion sizes and charges in these planes are distinctly different, and the initiation of a heteroepitaxial growth sequence for such a structure on another insulating oxide must take this into account.

Figure 4:
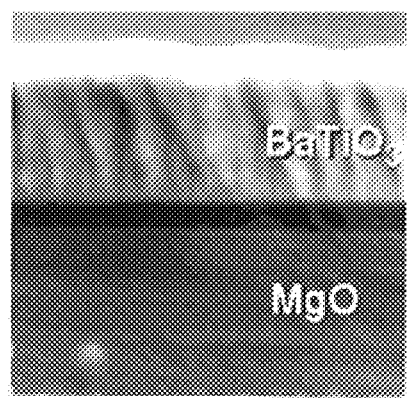
FIG. 4 is a SEM micrograph image of a cross section of a $BaTiO_3$ film of 0.6 μm thickness epitaxially grown upon MgO(001).

With reference to the micrograph image of FIG. 4, there is shown a fracture cross section of a representative $BaTiO_3$ film on (100)MgO. The FIG. 4 material was grown by using source-shuttering MBE techniques in ultra high vacuum. The film is adherent, single phase and optically clear. The epitaxy is cube-on-cube and uniquely results from the aforedescribed layering sequence that begins at the $TiO_2$-plane of the perovskite structure. The layering sequence is a requirement for single-orientation, epitaxial growth of a perovskite on MgO.

For a heteroepitaxial transition between insulating oxides, the interface electrostatics (ion-ion near neighbor interactions) of the first layers critically determine whether a commensurate structure can develop. For example, in going from MgO to $BaTiO_3$ on the (001) face of MgO, if the transition is initiated at a barium oxide plane, the structure at the interface cannot develop commensurately with the MgO surface. The basic incompatibility results from the large ion-size difference between barium and magnesium. In particular, it is impossible to avoid near-neighbor ion configurations where cation-cation or anion-anion repulsive interactions occur in large numbers. This naturally leads to interfacial energy and an inherent instability. In each study made up until now which has been directed to interfacial equilibrium and surface segregation phenomena for the alkaline earth oxides, the clear result emerged that no single layer of BaO on MgO existed that was energically stable. We have found that the energetic stability is of paramount importance to the growth of single-orientation perovskites on MgO.

For purposes of comparison, barium metal and oxygen was deposited onto a MgO surface at a substrate temperature of 500° C. to form BaO at a ½ monolayer coverage based on the MgO surface. This monolayer coverage is equivalent to one monolayer of BaO in $BaTiO_3$. The high interfacial energies that would result from commensurate BaO epitaxy on MgO should drive some mechanism for lowering the interfacial energy. In this regard, there is shown in FIG. 5 a cube model of the interface and associated reflection high-energy electron diffraction (RHEED) patterns from clean and ½ monolayer BaO-covered (100)MgO surfaces. The implication of surface segregation theories is that island-like nucleation of incommensurate BaO-type structures should develop, and it is believed that this does occur. The cube model shown in FIG. 5 shows an idealization of parallel and 45°-rotated morphologies of an (100) interface between MgO and BaO, and FIGS. 6a and 6b show diffraction patterns as experimental confirmation of their existence. The RHEED pattern shown in FIG. 6a results from an MgO surface prepared in the MBE system by growing 100 nm of MgO homoepitaxially on (001)MgO. The 0,0 and allowed 0,2 surface rods are seen. In FIG. 6b, surface diffraction at the same zone axis is illustrated but is modified by a single-layer-coverage BaO deposition. It can be seen in FIG. 6b that incommensurate crystallite orientations have formed and give rise to diffraction at what would be the 0,2 rod position for cube-on-cube BaO and at the 1,1 rod of 45°-rotated BaO as well. Moreover, in addition to the rod spacing indicating the microstructural characteristics of the interface, the diffraction intensity is modulated along the reciprocal lattice BaO rods in a Bragg-like manner, i.e., 3-dimensional diffraction occurs that is indicative of "islanding" or surface roughening. These multi-orientation, 3-dimensional island structures defeat any attempt at growing optical-quality, thick perovskite films.

Figure 7A:
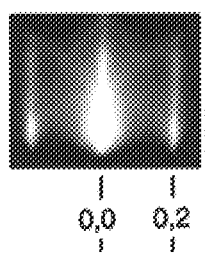
FIG. 7a is a photograph (like that of FIG. 6a) providing RHEED data for a clean MgO surface wherein the data is obtained along a [100] zone axis.
Figure 7B:
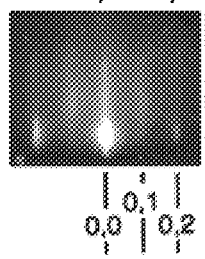
FIG. 7b is a photograph providing RHEED data for one monolayer coverage of $TiO_2$ on MgO(001) wherein the data is obtained along the [100] zone axis.
Figure 8A:
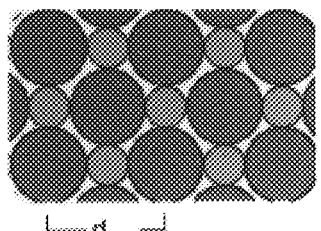
FIG. 8a is a plan view of a ball model of a clean MgO surface.
Figure 8B:
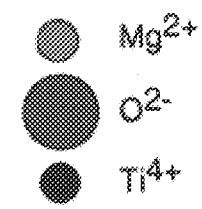
FIG. 8b is a plan view of a ball model of a one monolayer coverage of $TiO_2$ on MgO(001).
Figure 8B:
Figures 9, 10:
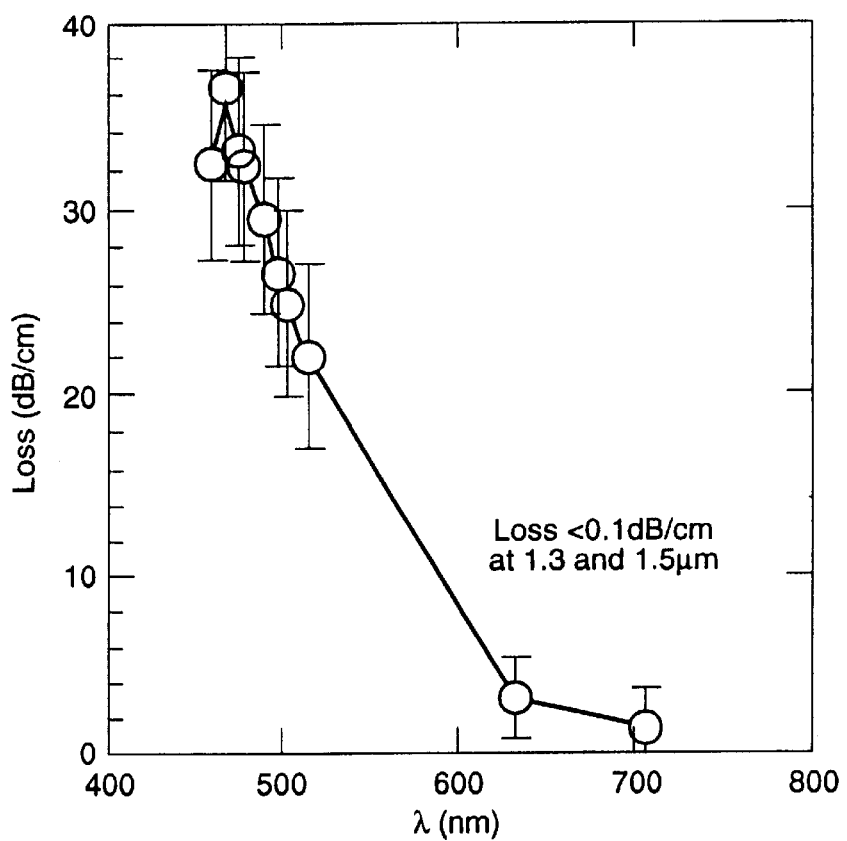
FIG. 9 is a table providing in-plane and out-of-plane structure data and index of refraction data for $SrTiO_3$ and $BaTiO_3$ thin films on MgO.
FIG. 10 is a graph providing data relating to wavelength dependence of optical loss in thin film $SrTiO_3$ on MgO.

With reference again to the construction of the structure of the present invention, there are provided in FIGS. 7a and 7b photographs of RHEED data which illustrate the dramatically different result that can be obtained by moving up one plane from the MgO layer (whose ball model is depicted in FIG. 8a) in the $BaTiO_3$ unit cell to the $TiO_2$ plane (whose ball model is depicted in FIG. 8b) and initiating the growth sequence at that point. A commensurate, atomically flat layer of $TiO_2$ can form in which every other cation row is vacant over the underlying $Mg^{2+}$ sites. This $TiO_2$ surface satisfies the electrostatic requirements for anion-cation near-neighbor pairs at the interface and is a low-energy, stable truncation of the MgO surface. The missing row of cations in this layer provides the energetically favorable sites for subsequent barium ion attachment to the crystal surface. As the perovskite growth is continued with alternating barium and titanium deposition cycles, $BaTiO_3$ grows layer-by-layer and strain relief can occur by nucleation of simple edge dislocations maintaining the single orientation cube-on-cube epitaxy. The $BaTiO_3$ lattice parameter relaxes to its strain-free, bulk value within ten unit cells from the original interface. The transition from heteropitaxy to homoepitaxy of the perovskite is completed with the desired single-orientation material and its advantageous long-range structural coherence. With the transition from heteroepitaxy to homoepitaxy accomplished in the manner described above, growth rates on the order of 1 μm/hr can be attained at temperatures as low as 500° C. by codeposition of barium and titanium or strontium and titanium with oxygen arrival rates equivalent to pressures of $10^{-7}$ torr. Structural and optical characteristics of the resulting thin films are provided in table form in FIG. 9.

The MBE process described above for the stabilization of the interface between a perovskite oxide and the alkaline earth oxide MgO provides an opportunity heretofore unavailable to exploit the electro-optic properties of thin-film epitaxial ferroelectrics in waveguide applications. In support of this contention, there is provided in FIG. 10 a plot of the waveguide dependence for optical loss in thin film $SrTiO_3$ on an MgO surface. Such a film is of high optical clarity and can be directly compared with the performance of $LiNbO_3$, the most commonly applied material in EO devices. It is believed that this is the first demonstration of such optical clarity of $SrTiO_3$ and $BaTiO_3$ grown in thin film form. The crystal quality that is obtained by the methods described above does not result from incremental improvements upon known information, but rather, is attained by directly addressing the fundamental requirements of interfacial energy minimization between perovskite and alkaline earth oxides.

It will be understood that numerous modifications and substitutions can be had to the aforedescribed embodiments without departing from the spirit of the invention. For example, although the aforedescribed process describes a build up of a relatively thick film of perovskite upon a MgO surface, a usable product which could, for example, permit the intrinsic properties of MgO to be studied may include only a single layer of $TiO_2$ overlying a MgO surface. Thus, in accordance with the broader aspects of the present invention, an embodiment of the process could terminate upon the formation of a single plane of $TiO_2$ (or another Group IVA element oxide) upon a MgO (or other alkaline earth oxide) surface.

Still further, although the aforementioned embodiments have been described in connection with perovskites which include a plane of titanium oxide ($TiO_2$), the principles of the present invention are applicable to other perovskites and oxides in the class of oxides known as spinels. The distinguishing structural characteristic of the perovskite or spinel oxide class with which this invention is concerned is recognized as a closest-packing of large cations and oxygens arranged as stacked sheets, and between these sheets are positioned higher valence, smaller cations. For example, in each of the perovskites $BaZrO_3$, $SrZrO_3$ and $PbZrO_3$, the metal zirconium provides the small cations in the crystalline structure (and bonds with oxygen in one plane of the structure to form $ZrO_3$) while the metal element Ba, Sr or Pb provides the larger cations. Similarly, in the perovskite $SrHfO_3$, the metal hafnium plays the role of the small cations while the metal strontium plays the role of the large cations. Along these lines, the metal oxide plane of a perovskite crystal containing the small cation can be comprised of a mixture of different, albeit suitable, e.g. Group IVA, elements. For example, the perovskite $BaTi_xZr_{1-x}O_3$ can be built epitaxially upon a substrate of MgO (or another alkaline earth oxide) in accordance with the principles of the present invention wherein titanium and zirconium are used in the construction of the crystalline planes of the perovskite structure which include the small cations. The perovskites are generically in the stochiometry of $ABO_3$ wherein A is an element like Mg, Ba, Sr, Ca and Pb, all of which have valence states of +2, and B is an element like Ti, Hf or Zr having valence states of +4.

Similarly, the crystal structure of an oxide known as a spinel is known to include a face whose lattice structure, when viewed frontally, simulates that of the crystalline form of a Group IVA oxide (see, e.g. the ball model of $TiO_2$ depicted in FIG. 8b). In other words, these spinel oxides are provided with a constituent oxide plane wherein the metal element of the oxide in the plane provides a relatively small cation with respect to the size of the oxygen in the crystalline form of the oxide and the metal and the oxygen atoms of the metal oxide are disposed at ordered sites across the oxide surface. The spinel oxides are provided with a second constituent oxide plane wherein the metal element of the oxide in this second plane provides a relatively large cation in the crystalline form of the oxide. The spinels are generically in the stochiometry of $A_2BO_4$ where A is an element, i.e. a large cation element, that is not magnetic, such as Mg, Ba, Sr, Ca and Pb. These elements all have filled outer shell electron configurations so that there are no unpaired electrons that give rise to permanent magnetic moments. B is an element, i.e. a small cation element, that can be magnetic, such as Ti, V, Cr, Mn, Fe, Co, Ni and Cu. These latter-mentioned elements come from the transition or rare earth element series and have unfilled inner electron shells containing unpaired electrons which are then responsible for their permanent magnetic moments. The magnetic moments associated with these "B" elements undergo order/disorder phenomena associated with ferromagnetic phase transformations and then exhibit magneto-optic properties. These properties can be taken advantage of in a number of devices, and in particular, are believed to be well-suited for use in Faraday Rotators for optical isolators and in magnetic memory applications.

It is believed that due to the aforediscussed similarity in the crystalline forms of the Group IVA element oxides, the perovskites and the spinels, a perovskite, a spinel or a constituent oxide plane of a perovskite or a spinel can be grown upon a surface provided by either of the Group IVA element oxides or an oxide constituent of a perovskite or spinel in accordance with the principles of the present invention. To this end, MBE techniques are used to grow an initial constituent plane of a perovskite or spinel crystal epitaxially upon the metal oxide wherein the metal element of the constituent oxide plane provides a large cation in the perovskite or spinel structure. The build up of epitaxial layers can then be continued (e.g. toward the formation of perovskite in bulk or spinel in bulk) by growing, with MBE techniques, a second epitaxial layer upon the initial layer wherein the second epitaxial layer is comprised of a constituent metal oxide plane of the perovskite or spinel wherein the constituent metal oxide plane of the second epitaxial layer includes the metal element which provides the small cation in the perovskite or spinel crystalline structure.

Accordingly, the aforedescribed embodiments are intended for the purpose of illustration and not as limitation.

We claim:

1. A structure for use in a semiconductor or wave guide application comprising:

a body having a surface defined by a (001) oriented alkaline earth oxide and a (100) oriented film arranged cube-on-cube over the alkaline earth oxide wherein the film includes a single plane of metal oxide consisting of oxygen and a metal element selected from the group of metals consisting of Ti, Zr, Hf, V, Cr, Mn, Fe, Co, Ni, and Cu and wherein the single plane of metal oxide directly contacts and is commensurate with the alkaline earth oxide surface.

2. The structure as defined in claim 1 wherein the film includes a first layer overlying the single plane wherein the first layer is comprised of a single plane of metal oxide consisting of a metal oxide constituent of a perovskite crystal or a spinel crystal wherein the metal element of the metal oxide constituent provides the large cation of the crystalline form of the perovskite or spinel structure and wherein the first layer directly covers and is commensurate with the underlying single plane of metal oxide.

3. The structure as defined in claim 2 wherein the metal oxide constituent of the first layer is one metal oxide constituent of a perovskite crystal or a spinel crystal and the film further includes a second layer epitaxially overlying the first layer wherein the second layer is comprised of a single plane of metal oxide consisting of another metal oxide constituent of the perovskite crystal or the spinel crystal wherein the metal element of the another metal oxide constituent provides the small cation of the crystalline form of the perovskite or spinel structure and wherein the second layer directly covers and is commensurate with the underlying single plane layer of metal oxide.

4. The structure as defined in claim 3 wherein the film includes a series of commensurate single plane layers of the constituent metal oxides of a perovskite crystal or a spinel crystal overlying the second layer wherein the single plane layers of the constituent metal oxide of the perovskite crystal or the spinel crystal which includes the metal element providing the small cation alternate with the single plane layers of the constituent metal oxide of the perovskite crystal or the spinel crystal which include the metal element providing the large cation.

5. The structure as defined in claim 4 further comprising a substrate of a semiconducting material which underlies the alkaline earth oxide.

6. The structure as defined in claim 5 used as a component in an integrated electronic circuit.

7. The structure as defined in claim 1 further comprising a substrate of a semiconducting material which underlies the alkaline earth oxide.

* * * * *